United States Patent
Maa et al.

(10) Patent No.: US 6,395,625 B1
(45) Date of Patent: May 28, 2002

(54) METHOD FOR MANUFACTURING SOLDER MASK OF PRINTED CIRCUIT BOARD

(75) Inventors: Chong-Ren Maa, Taipei; Wan-Kuo Chih, Hsinchu; Ming-Sung Tsai, Keelung, all of (TW)

(73) Assignee: S & S Technology Corporation, Taoyuan (TW)

( * ) Notice: Subject to any disclaimer, the term of this patent is extended or adjusted under 35 U.S.C. 154(b) by 0 days.

(21) Appl. No.: 09/974,908

(22) Filed: Oct. 12, 2001

(51) Int. Cl.7 .................. H01L 21/44; H01L 21/4263
(52) U.S. Cl. .................. 438/612; 438/613; 438/683; 438/586
(58) Field of Search .................. 438/612, 613, 438/656, 683, 586, 106, 107, 108, 116; 257/691, 700, 710, 664, 778

(56) References Cited

U.S. PATENT DOCUMENTS

| | | | | |
|---|---|---|---|---|
| 3,620,933 A | * | 11/1971 | Grunwald | 134/42 |
| 3,874,440 A | * | 4/1975 | Voisin | 164/113 |
| 5,047,114 A | * | 9/1991 | Frisch et al. | 156/308.2 |
| 5,065,227 A | * | 11/1991 | Frankeny et al. | 257/698 |
| 5,316,787 A | * | 5/1994 | Frankeny et al. | 29/25.01 |
| 5,576,135 A | * | 11/1996 | Nishikawa | 430/126 |
| 5,861,076 A | * | 1/1999 | Adlam et al. | 148/272 |
| 2001/0042637 A1 | * | 11/2001 | Hirose et al. | 174/255 |

* cited by examiner

Primary Examiner—Michael S. Lebentritt
(74) Attorney, Agent, or Firm—Browdy and Neimark

(57) ABSTRACT

A solder mask manufacturing method adapted to apply a solder mask on a surface of a substrate of a circuit board, said surface is provided with a conductor pattern having an unsheltered portion and a sheltered portion which is covered by said solder mask. The method comprises the steps of: a) disposing a layer of semi-solid solder mask material having an expansion coefficient substantially the same as that of the substrate on the surface of said substrate to cover said copper conductor pattern, and a metal foil covering the material layer; b) applying pressure to the metal foil and applying baking treatment to cure the solder mask material in to solid; c) utilizing chemical solution and plasma etching to remove the metal foil and the solid solder mask material above the unsheltered portion of said copper conductor pattern respectively such that the unsheltered portion can be exposed; and d) using chemical solution to remove the residual metal foil.

8 Claims, 2 Drawing Sheets

METHOD FOR MANUFACTURING SOLDER MASK OF PRINTED CIRCUIT BOARD

FIELD OF THE INVENTION

The present invention relates generally to a method for manufacturing a printed circuit board,(PCB), and more particularly to a method for manufacturing the solder mask of the printed circuit board.

BACKGROUND OF THE INVENTION

In the manufacture of a conventional printed circuit board, after forming the outer layer conductor pattern, a solder mask protective treatment has to be applied to the conductor pattern so as to prevent oxidation of the conductor pattern or solder connection short circuit.

In a solder mask manufacturing process for the conventional printed circuit board, a solder mask paint is applied to the surface of the circuit board by halftone printing, roller type coating, screen coating or electrostatic spray coating, etc. After pre-baking, drying and cooling, exposure is employed to display images. The method of imaging removes unnecessary paint, and the resin in the remaining paint is completely cured by high-temperature baking in the final step to form a solder mask covered on the surface of the PCB to protect the conductor pattern.

The conventional solder mask manufacturing process has the following advantages:

1. Using halftone printing or roller type coating to apply the solder mask paint to the printed circuit board requires multiple halftone printing or roller printing steps in order to accumulate the paint to the desired thickness, which is complicated.
2. During the process of baking the printing circuit board at high temperature, since the resin material in the solder mask paint has an expansion coefficient different from that of the circuit board substrate, internal stress will form between the resin material and the circuit board to cause the bend of the printed circuit board.
3. The thickness of the solder mask paint layer is not easy to control, resulting in electric instability of the circuit board.
4. Air bubbles can easily get in during the process of coating the solder mask paint to result in poor reliability quality of the solder mask and shortened life of the solder mask layer.
5. Coating the circuit board with solder mask paint cannot fill through holes in the circuit board with solder mask paint. Therefore, before coating, insulating fillers are disposed in the through holes respectively and are ground flat before coating the solder mask paint, thereby increasing manufacturing time and cost of the printing circuit board.
6. When coating the circuit board with solder mask paint, coating layer cannot be easily formed on the copper foil conductor pattern, and the bonding therebetween is relatively poor.

SUMMARY OF THE INVENTION

The primary object of the present invention is to provide a solder mask manufacturing method for a printed circuit board that has good quality and that will not cause bend of the circuit board.

In order to achieve the aforesaid object, the present invention is to provide a solder mask manufacturing method adapted to apply a solder mask on a surface of a substrate of a circuit board, said surface is provided with a conductor pattern having an unsheltered portion and a sheltered portion which is covered by said solder mask. The method comprises the steps of: disposing a layer of semi-solid solder mask resin material having an expansion coefficient substantially the same as that of the substrate on the surface of said substrate to cover said copper conductor pattern, and a metal foil for covering the resin material layer; applying predetermined pressure to the metal foil and baking at a predetermined temperature for a predetermined time to cure the semisolid solder mask resin material; utilizing chemical solution etching to remove the metal foil above the unsheltered portion of said copper conductor pattern, and using plasma etching to remove the solid solder mask material above said unsheltered portion of said conductor pattern such that the unsheltered portion of the said conductor pattern can be exposed; and lastly, using chemical solution to remove the residual metal foil.

DETAILED DESCRIPTION OF THE INVENTION

Figure 1:
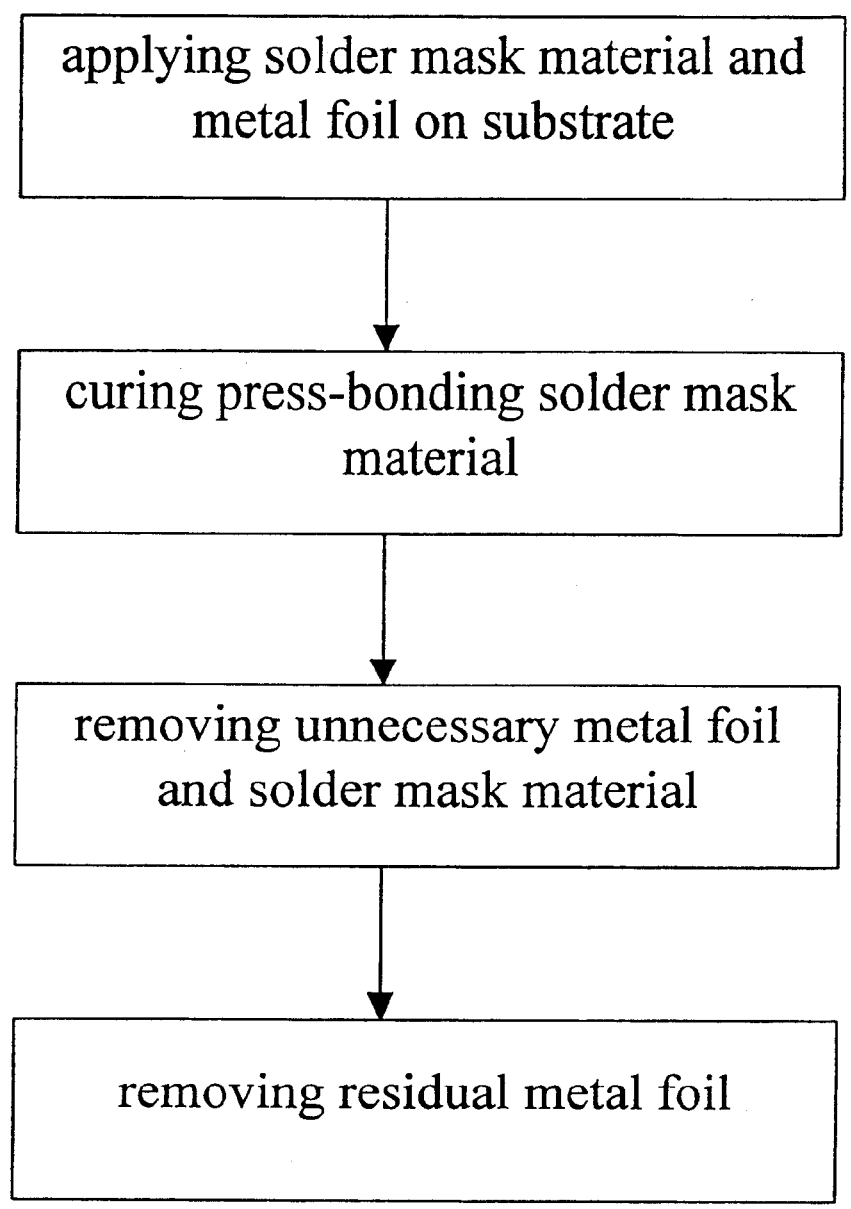
FIG. 1 is a flow chart of a preferred embodiment of the present invention.

Referring to FIG. 1, the solder mask manufacturing method for a printed circuit board of the present invention adapted to apply a solder mask on a surface of a substrate of the printed circuit board, said surface of the substrate is provided with a copper conductor pattern having an unsheltered portion and a sheltered portion which is covered by said solder mask. The method includes the following steps:

1. Coating of solder mask resin material: disposing a layer of semi-solid solder mask resin material of a predetermined thickness and expansion coefficient identical or similar to that of the circuit board substrate on the surface of the substrate such that the copper conductor pattern is covered by said resin material, and then a metal foil of a predetermined thickness is disposed to cover the solder mask resin material.
2. Press bonding and curing of solder mask resin material: applying predetermined pressure to the metal foil such that solder mask resin material between the metal foil and the substrate of the printed circuit board tightly covers the surface of the substrate, and then baking treatment is applied at a predetermined temperature for a predetermined time to cure the semi-solid solder mask resin material.
3. Removing unnecessary solder mask material: utilizing chemical solution etching to remove the metal foil above the unsheltered portion of the copper conductor pattern, and then using plasma etching to remove the solder mask resin material above the unsheltered portion of the cooper conductor pattern such that said unsheltered portion of the copper unsheltered portion can be exposed.
4. Removal of metal foil: using chemical solution to remove the residual metal foil covering the solder mask material, thereby completing the manufacturing of the solder mask.

The aforesaid is the steps of the process of this invention. Hereinafter, the invention is described in detail using a preferred embodiment with reference to FIG. 2.

Figure 2:
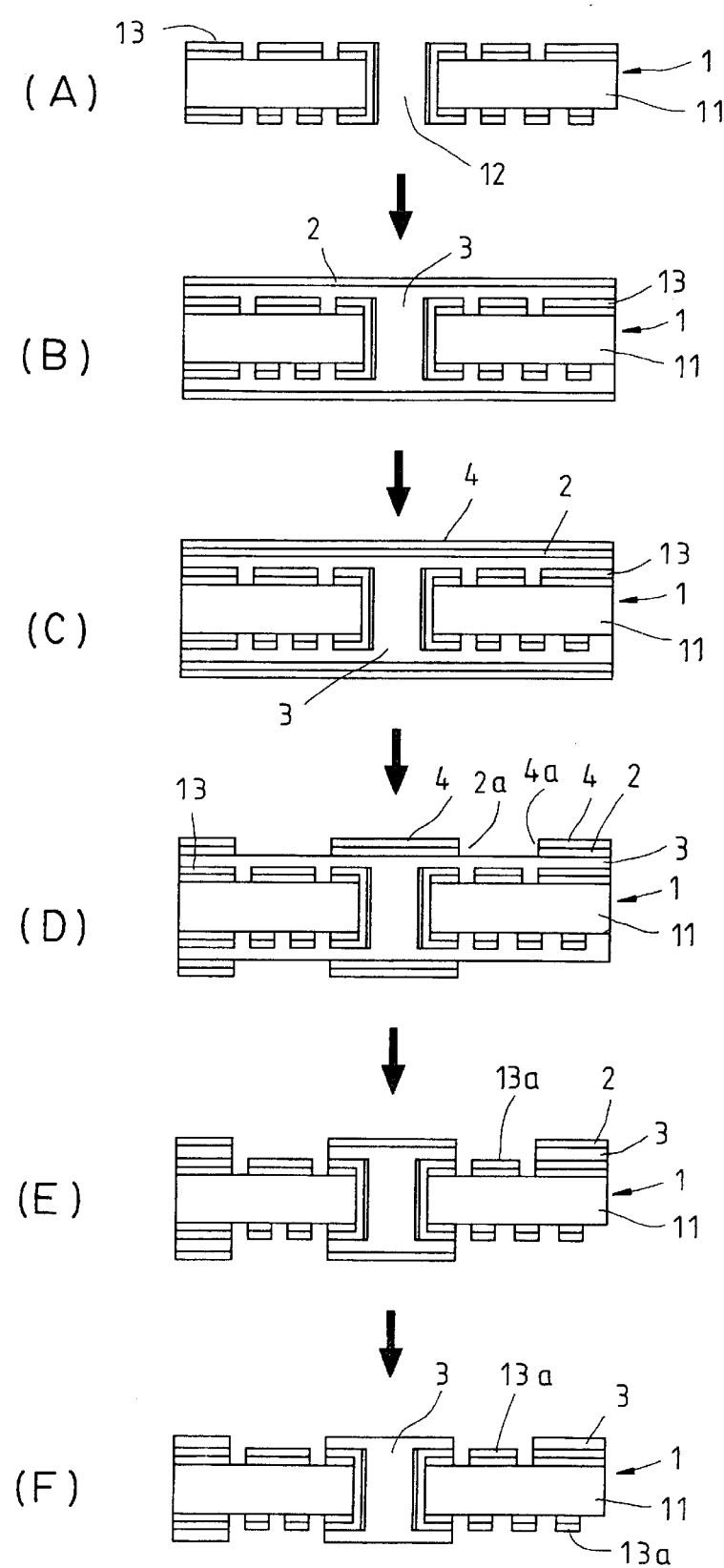
FIG. 2 is a schematic view of the preferred embodiment of the present invention.

Referring to FIG. 2, in the solder mask manufacturing process for a printed circuit board of this invention, a printed circuit board 1 which has undergone the steps of hole drilling and plating, and outer layer copper conductor pattern circuit layout is subjected to solder mask treatment of the outer layer conductor pattern of the circuit board 1. The material of the substrate 11 of the printed circuit board 1 is multi-function epoxy resin. Therefore, in this embodiment, the printed circuit board 1 has a plurality of through holes 12 and predetermined outer layer copper conductor pattern 13 (see FIG. 2A). The copper conductor pattern 13 can be defined into two portions, namely, the unsheltered portion 13a and the sheltered portion. The solder mask manufacturing process for the printed circuit board 1 is as follows:

1. Coating of solder mask material:

Firstly, prepare a aluminum foil 2 with a thickness between 20 $\mu$m ~40 $\mu$m. Apply solder mask resin material 3 of a thickness between 30 $\mu$m ~100 $\mu$m to one side of the aluminum foil 2. The solder mask material is made of multifunction epoxy resin paint identical to that of the substrate 11 of the printed circuit board 1 with organic solution added, and is pre-baked to form a semi-solid state (i.e. thick and sticky). Cover the side of the circuit board 1 that is to be solder mask treated with the solder mask resin material on the aluminum foil 2 so that the solder mask material 3 is sandwiched between the substrate 11 of the circuit board 1 and the aluminum foil 2 (see FIG. 2B).

2. Press bonding and curing of solder mask material:

Apply uniform force of 10~40 kgw/cm$^2$ to the aluminum foil 2, and bake the solder mask material 3 at a temperature of 185° C. for 1.5 hours to 3 hours such that:

a) The solder mask material 3 fills through holes 12 and micro-pores such as blind holes in the substrate 11 of the circuit board 1 due to pressure applied and tightly covers the substrate 11 to form a cover layer.

b) Organic solution in the solder mask material 3 evaporates when heated, and epoxy resin in the solder mask material 3 gradually cures to form a solder mask protective layer.

After curing of epoxy resin in the solder mask material 3 to form a solder mask protective layer, release the pressure and temperature applied.

3. Removal of unnecessary solder mask material:

Press a dry film photo-resist 4 on the aluminum foil 2 with suitable temperature and pressure (as shown in FIG. 2C), and subject the dry film photo-resist 4 to light exposure in conjunction with a negative film so that the dry film photo-resist 4 generates images relative to positions of the sheltered portion of the copper conductor pattern 13. Etch the parts of the dry film 4a without images and the aluminum foil 2a using carbonic acid and ferric chloride (FeCl$_3$) solution with specific gravity 1.3~1.5 and temperature of 40° C.~60° C. so that epoxy resin solder mask layer at where the aluminum foil was removed is exposed on the outside (as shown in FIG. 2D), and then remove the residual dry film 4 using sodium hydroxide of 1~3 wt % and temperature of 45° C.~65° C.

Subsequently, plasma etching is used to remove the exposed epoxy resin solder mask layer so that the unsheltered portion 13a of the copper conductor pattern is exposed on the substrate 11 (as shown in FIG. 2E).

4. Removal of metal foil:

Lastly, use phosphoric acid (H$_3$PO$_4$) solution of 60~80% volume to volume and temperature of 50° C.~80° C., or hydrochloric acid (HCl) with concentration of 10%~40% and temperature of 20° C.~40° C. to remove the residual aluminum foil 2 (as shown in FIG. 2F), completing the entire solder mask manufacturing process. The printed circuit board 1 can subsequently undergo nickel-plating operation of the unsheltered portion 13a of the copper conductor pattern 13. Since phosphoric acid or hydrochloric acid can corrode aluminum and will not corrode copper severely, this is the reason why this embodiment selects aluminum foil as cover layer of the solder mask material.

As techniques relating to pressing the dry film, light exposure, imaging and plasma etching are known art, it is not necessary to further describe the same herein.

Hereinafter, the advantages of the embodiment are set forth as follows:

1. The thickness of the solder mask 3 can be set at one time to reduce process step so as to reduce process costs.

2. Since the solder mask 3 and substrate 11 of the circuit board 1 are of the same multifunction epoxy resin, the expansion coefficient thereof is the same as that of substrate 11 of the circuit board 1. Therefore, during the process of baking in step 2, internal stress will not be present between the solder mask 3 and the substrate 11 so as not to cause bend of the circuit board 1. Particularly, application of uniform force to the substrate 11 during the process of baking in step 2 will prevent deformation of the circuit board 1.

3. As the solder mask material 3 is attached to the substrate 11, it is subjected to an uniform force via the aluminum foil 2 for a period of time, the solder mask material 3 will cover the circuit board 1 with uniform thickness and forms a solder mask protective layer with uniform thickness after curing so that the circuit board 1 has stable electric characteristics.

4. As the solder mask material 3 is attached to the substrate 11, it is subjected to an uniform force via the aluminum foil 2 until cured, air bubbles will not get thereinto during that period of time and can therefore enhance quality of the solder mask protective layer and prolong the life thereof.

5. Due to the pressure applied, the solder mask material 3 can fill through holes and micro-pores such as blind holes in the substrate 11 simultaneously. Therefore, it is not necessary to fill the through holes with insulating filler material and grind the same even prior to solder mask of the circuit board 1, thereby reducing manufacturing time and costs of the printed circuit board.

6. As the solder mask material 3 is caused to cover the surface of the substrate 11 by applying pressure and heating, copper conductor pattern 13 on the substrate 11 can easily attach thereto and will not detach therefrom.

Although the present invention has been illustrated and described with reference to the preferred embodiment thereof, it should be understood that it is in no way limited to the details of such embodiment but is capable of numerous modifications within the scope of the appended claims.

What is claimed is:

1. A solder mask manufacturing method of a printed circuit board adapted to apply a solder mask on a surface of a substrate of the printed circuit board, the surface of the substrate is provided with a copper conductor pattern having an unsheltered portion and a sheltered portion being covered by said solder mask, the manufacturing method comprising the following steps:

a) disposing a layer of semi-solid solder mask material of a predetermined thickness and expansion coefficient substantially identical to that of the substrate on the surface of the substrate such that the copper conductor pattern is covered by said solder mask material layer, and then covering a metal foil of a predetermined thickness on said solder mask material layer;

b) applying predetermined pressure to the metal foil such that the solder mask material layer between the metal foil and the substrate tightly covers the surface of the substrate of the printed circuit board, and then baking treatment is applied at a predetermined temperature for a predetermined time to cure the semi-solid solder mask material into solid;

c) utilizing chemical solution etching to remove the metal foil above the unsheltered portion of the copper conductor pattern, and further using plasma etching to remove the solid solder mask material above the unsheltered portion of the copper conductor pattern such that said unsheltered portion of said copper conductor pattern can be exposed outside;

d) using chemical solution to remove the residual metal foil, thereby completing the manufacturing of the solder mask on the substrate of the printed circuit board.

2. The manufacturing method as claimed in claim 1, wherein the metal foil is aluminum foil, and the chemical solution used to remove the aluminum foil via etching in step c) is ferric chloride ($FeCl_3$) solution, and the chemical solution used to remove aluminum foil in step d) is phosphoric acid ($H_3PO_4$) solution.

3. The manufacturing method as claimed in claim 1, wherein the metal foil is aluminum foil, and the chemical solution used to remove the aluminum foil via etching in step c) is ferric chloride ($FeCl_3$) solution, and the chemical solution used to remove the aluminum foil in step d) is hydrochloric acid (HCl) solution.

4. The manufacturing method as claimed in claim 1, wherein the material of the substrate of the printed circuit board is multi-function epoxy resin, and the semi-solid solder mask material in step a) is multi-function epoxy resin paint having an expansion coefficient substantially identical to that of the substrate with organic solution added and subjected to pre-baking.

5. The manufacturing method as claimed in claim 1, wherein the solder mask material is pre-applied to one side of the metal foil, and the surface of the substrate to be solder masked is covered with the solder mask material on the metal foil such that the solder mask material is sandwiched between the substrate and the metal foil.

6. The manufacturing method as claimed in claim 2, wherein the thickness of the aluminum foil is between 20 $\mu$m~40 $\mu$m, the specific gravity of the ferric chloride ($FeCl_3$) is between 1.3~1.5, and the temperature of the ferric chloride is between 40° C.~60° C., and the volume to volume of the phosphoric acid ($H_3PO_4$) is between 60%~80%, and the temperature of the phosphoric acid is between 50° C.~80° C.

7. The manufacturing method as claimed in claim 3, wherein the thickness of the aluminum foil is between 20 $\mu$m~40 $\mu$m, the specific gravity of the ferric chloride ($FeCl_3$) is between 1.3~1.5, and the temperature of the ferric chloride is between 40° C.~60° C., and the concentration of the hydrochloric acid (HCl) is between 10%~40%, and the temperature of the hydrochloric acid is between 20° C.~40° C.

8. The manufacturing method as claimed in claim 3, wherein the solder mask material is pre-coated to one side of the metal foil with a thickness of about 30 $\mu$m~100 $\mu$m, and the surface of the substrate to be solder masked is covered with the solder mask material on the metal foil such that the solder mask material is sandwiched between the substrate and the metal foil, the pressure applied in step b) being uniform and between 10~40 kgw/cm$^2$ and continuing for 1.5 hours to 3 hours, the baking temperature in step b) being 180° C. continuing for 1.5 hours to 3 hours.

* * * * *